United States Patent [19]

Bernet et al.

[11] 4,353,057

[45] Oct. 5, 1982

[54] SYSTEM FOR DIGITIZING TRANSIENT SIGNALS

[75] Inventors: Jean-Marie Bernet; Gabriel Lejeune, both of Paris, France

[73] Assignee: Thomson-CSF, Paris, France

[21] Appl. No.: 46,818

[22] Filed: Jun. 8, 1979

[30] Foreign Application Priority Data

Jun. 13, 1978 [FR] France ............................. 78 17621

[51] Int. Cl.³ ............................................ H03K 13/02
[52] U.S. Cl. ............................. 340/347 SH; 328/151; 340/347 AD; 324/102
[58] Field of Search ...................... 328/151; 324/102; 340/347 AD, 347 M, 347 SH; 179/15.5 ST

[56] References Cited

U.S. PATENT DOCUMENTS 3,059,228  10/1962  Beck ........................... 340/347 SH
3,969,705   7/1976  Waggener .................... 179/15.5 ST

FOREIGN PATENT DOCUMENTS 2326806  4/1977  France .
1505330  3/1978  United Kingdom .

OTHER PUBLICATIONS

Baldis, "Review of Scientific Instruments", vol. 44, No. 6, Jun. 1973, pp. 712–714.
Meek, "New Electronics", Mar. 8, 1977, vol. 10, No. 5, pp. 68, 72.

Primary Examiner—Charles D. Miller
Attorney, Agent, or Firm—Karl F. Ross

[57] ABSTRACT

A system for digitizing transient signals comprises a plurality of high-speed sampling gates connected in parallel to a common input terminal, these gates working in interleaved relationship into respective charge-transfer devices each including a multiplicity of storage cells which are successively loaded in a first operational phase with analog samples delivered by the corresponding gate. After having been fully loaded, the several transfer devices are read out cell by cell in a second operational phase via a multiplexer into an analog/digital converter at a rate which is substantially lower than the sampling rate.

7 Claims, 4 Drawing Figures

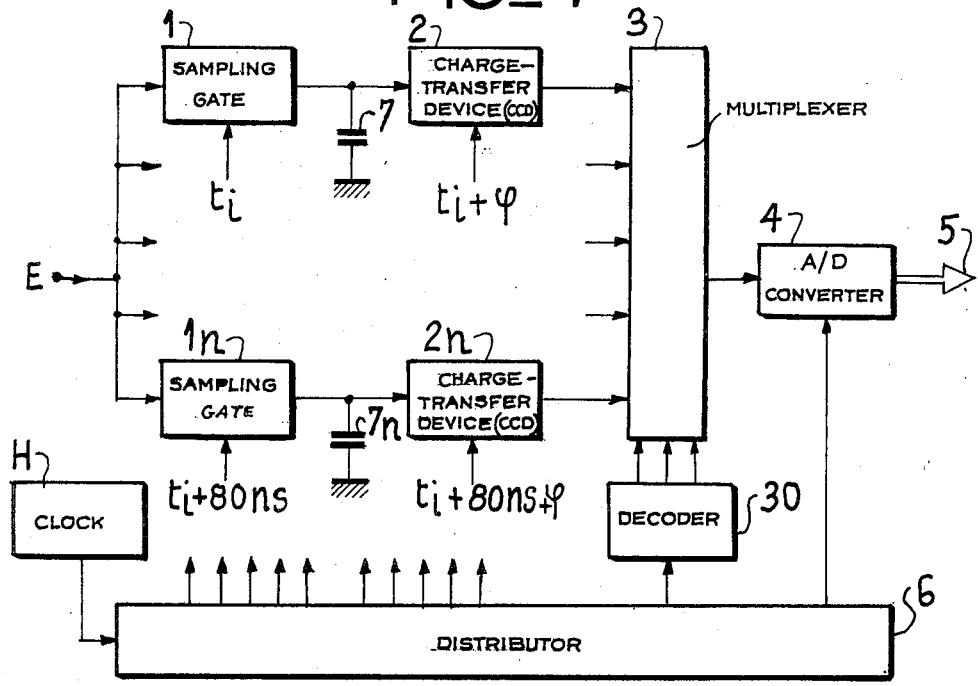
FIG_1
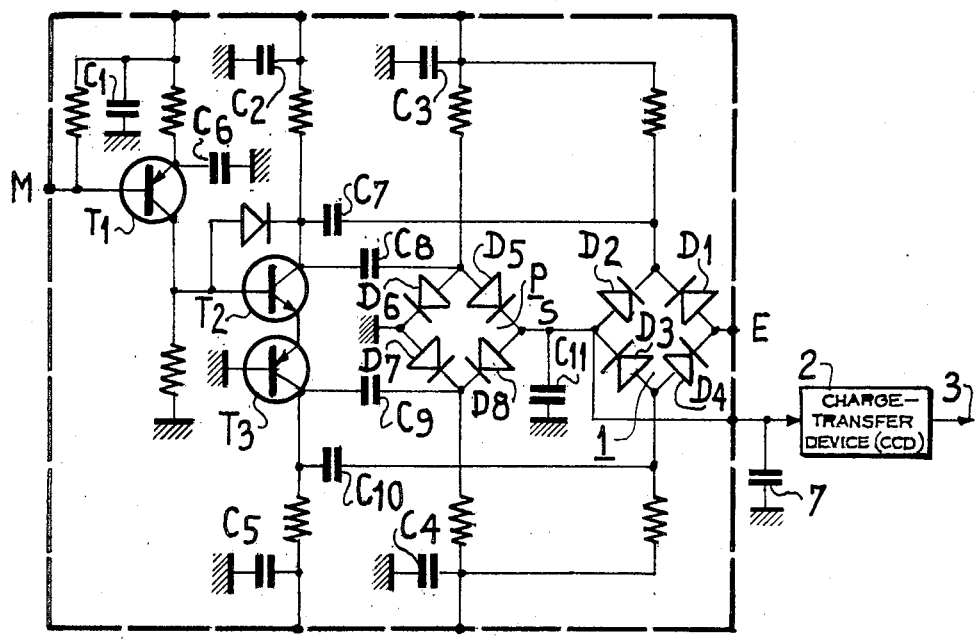
FIG_2

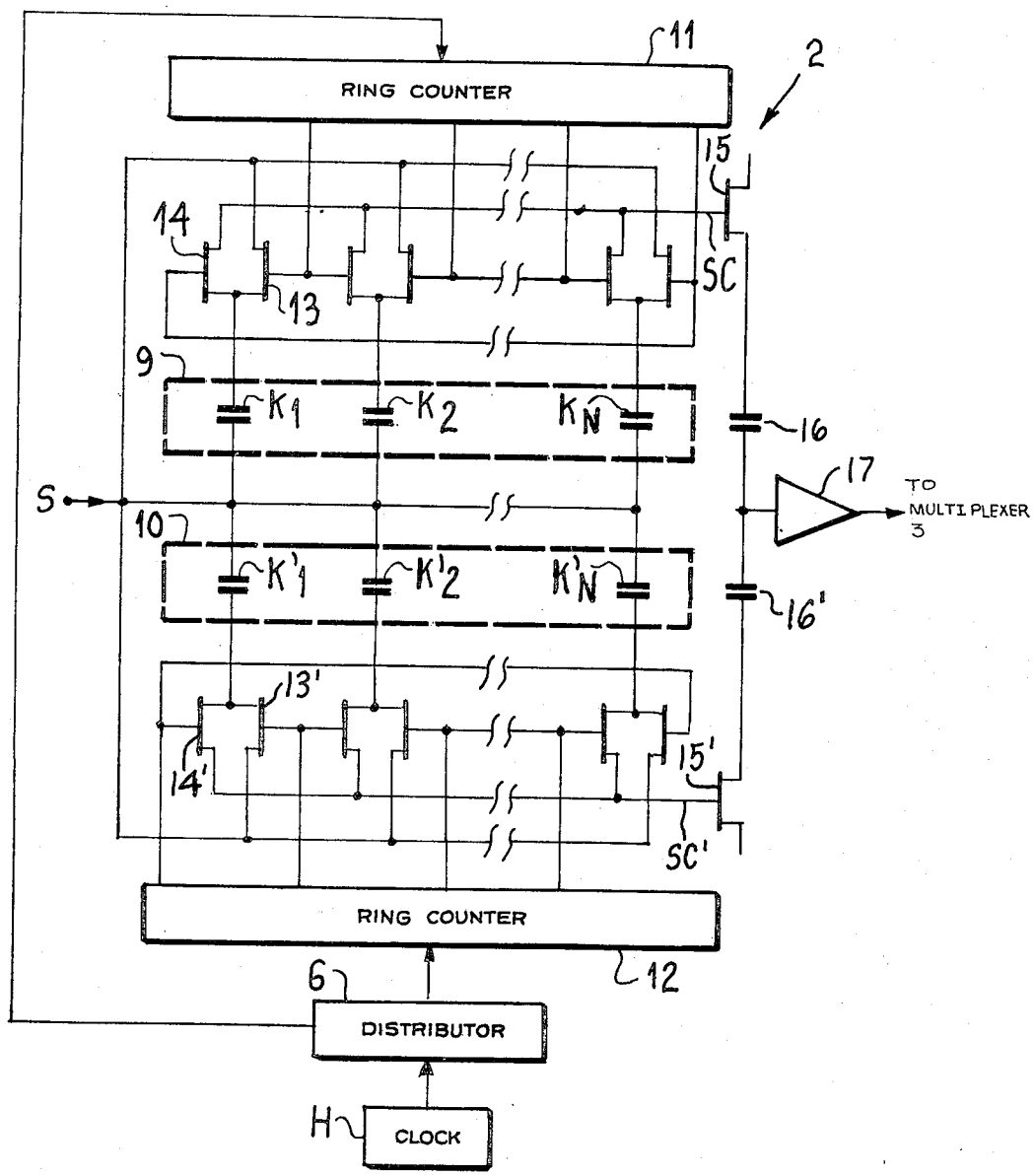
FIG_3

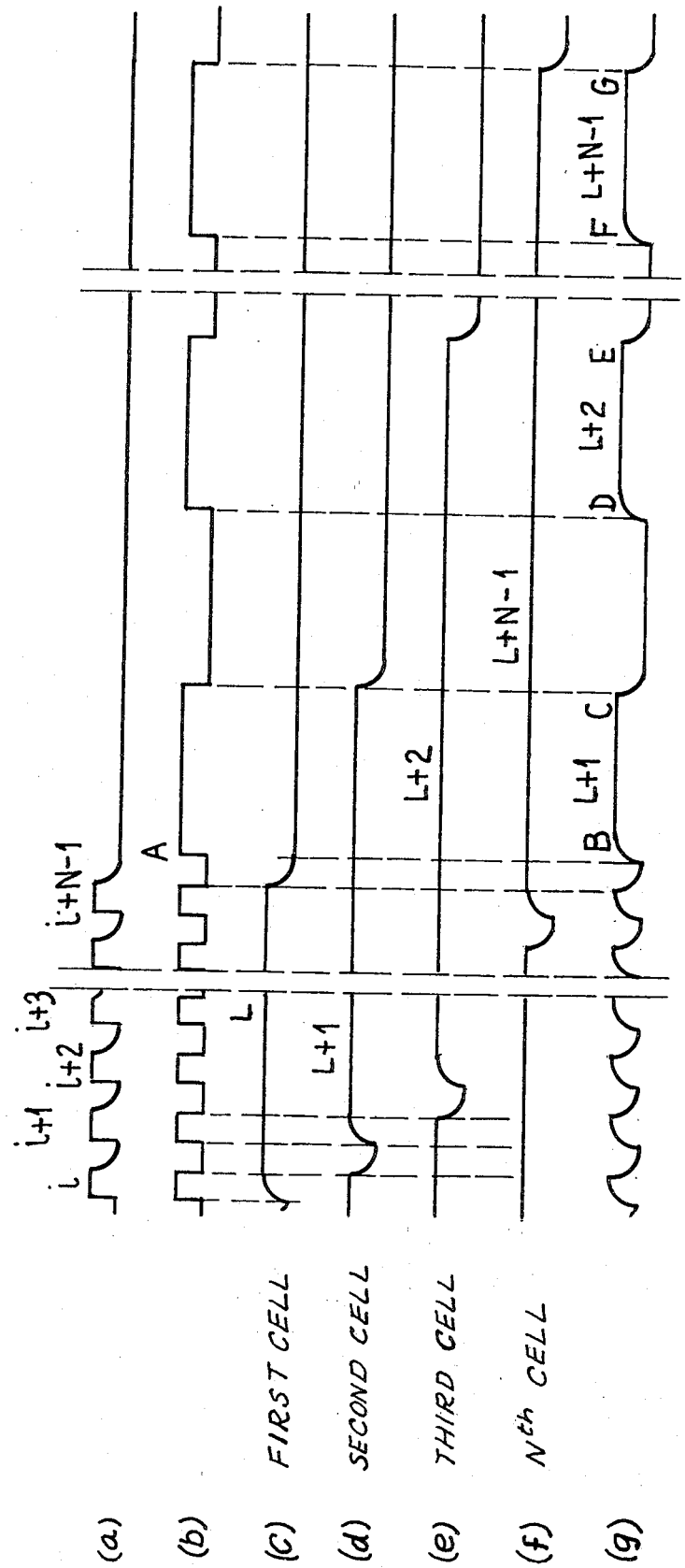

SYSTEM FOR DIGITIZING TRANSIENT SIGNALS

FIELD OF THE INVENTION

Our present invention relates to a system for digitizing transient signals, especially signals of the nonrepetitive type. Such a system may be classified as belonging to the field known as "fast electronics".

BACKGROUND OF THE INVENTION

In a digitizing system of this character, a certain number of samples are taken at a given rate from a single or nonrepetitive signal. These samples are digitized and then stored in a memory for recordal and utilization.

Three main types of transient-signal digitizers can be defined.

The first type is designed to operate at a digitizing rate less than or equal to some twenty megahertz. A system of this first type includes a clock-controlled sampling device which receives the signal to be processed, an analog-digital series or series-parallel converter and a memory which stores the digitized data.

This system has a correct range which may be greater than or equal to 8 bits and a number of points limited by the memory capacity.

The second type of digitizer is able to work at a rate higher than 20 MHz.

Such a digitizer does not differ essentially from the one previously described except in the arrangement of the analog-digital converter, which is formed by a chain of comparators each biased at a voltage which corresponds to a quantization level. This chain contains as many comparators minus 1 as there are quantization levels.

Such a system has a limited dynamic range and a high weight of components.

The third known type of digitizer uses an oscilloscope with a memory.

In this case, on reception, the signal is recorded in real time in a memory mosaic similar to that of an oscilloscope. A slow sweep of television type empties the cells which were loaded by the recording and in this way produces a slow-rate digitized video signal.

Such a system offers the advantage of an apparently high sampling rate of the order of 1 GHz or more. However, the number of points is limited to a few hundred and distortions occur which can be attributed to nonlinearity in the sweep.

OBJECT OF THE INVENTION

The object of our present invention is to provide a digitizing system which avoids the disadvantages mentioned above.

SUMMARY OF THE INVENTION

We realize this object, in accordance with our present invention, by the provision of a plurality of sampling gates connected in parallel to an input terminal carrying the transient samples to be digitized, each sampling gate being connected to a respective charge-transfer device including a multiplicity of cells which are successively loaded by first switch means with incoming signal samples from the respective sampling gates and whose contents are successively read out by second switch means—in the order of their loading—to a common output circuit; the output circuits of all these devices are cyclically connectable, via multiplexer means, to an analog-digital converter working into a utilization or load circuit. The sampling gates, the charge-transfer devices and the multiplexer means are controlled by timing means briefly opening these gates in cyclic succession at a relatively fast clock-pulse rate and operating the first switch means of the respective charge-transfer devices in synchronism therewith; upon the loading of the cells of all these devices, the second switch means and the multiplexer means are synchronously operated in cyclic succession at a relatively slow clock-pulse rate for reading out the contents of all cells to the converter and unloading each cell following its readout. In the specific system described hereinafter, one cell of each device is always empty during such readout.

BRIEF DESCRIPTION OF THE DRAWING

The above and other features of our invention will now be described in conjunction with the accompanying drawing in which:

FIG. 1 is a block diagram of a system embodying our invention;

FIG. 2 is a circuit diagram of input circuitry for a charge-transfer device shown in FIG. 1;

FIG. 3 is a detailed diagram of that charge-transfer device; and

FIG. 4 is a set of graphs relating to the operation of the system.

SPECIFIC DESCRIPTION

FIG. 1 shows in schematic form a fast-digitizing system in accordance with the invention.

An input terminal E, at which the signal to be digitized appears, is connected in parallel to several very fast sampling gates 1 to $1_n$. Each gate is connected to a respective transfer device 2 to $2_n$ of the charge-coupled (CCD) type whose output is connected to an analog multiplexer 3. The output of this multiplexer is connected to an analog-digital converter 4 whose output is connected to a load 5 not further specified. All the devices referred to are controlled by a block H, acting as a rate timer, which feeds a distributor 6 that emits clock pulses at the frequency required and is connected to multiplexer 3 through a decoder 30. Shunt capacitors 7 to $7_n$ are disposed at the input of each charge-transfer device.

For the operation of such a system, the analog signal which appears at input E is sampled by the very fast gates 1 to $1_n$. Each gate, for example, takes a sample very 100 nsec and the instant at which a gate samples is offset by 20 nsec with respect to that of the adjacent gate. These circuits are thus controlled by clock pulses at instants $t_i$ for the first gate, $t_i+20$ nsec for the second gate, and so on. In the 100 nsec which follow, each sample is fed into the associated charge-transfer device. Such a device may contain a hundred cells and serves to store temporarily the analog data sampled which are delivered by the associated gate. Writing of the samples in the cells takes place at a rate of the order of 10 MHz in the example described. When the charge-transfer devices are fully loaded, the clock changes its rate and switches, for example, to a frequency of 20 kHz, the delay being marked 0 on the diagram in FIG. 1 It is at this rate, beginning at an instant $(t_i+\phi)$ for device 2, that the data coming from the various charge-transfer devices are applied in parallel to a multiplexer 3. The analog-digital converter 4 can operate at a relatively slow rate, e.g. of the order of 100 kHz as determined by distributor 6, and thus delivers a 10-bit word every 10 microseconds.

It may be noted that the numerical values given are merely an example. The system is essentially the same if the clock H operates at a frequency of 50 MHz or 50 kHz, for instance.

The system of FIG. 1 can be realized as a printed-circuit board of relatively small size, about 190×120 mm, with up to five very fast sampling gates. Such a board then behaves as a signal digitizer operating at a rate of the order of 50 megawords per second and is able to take 500 samples and digitize them in 10 or 12 bits.

FIG. 2 shows schematically the input circuitry of charge-transfer device 2.

The signal to be recorded is applied from input terminal E to sampling gate 1 here shown as a rectifier bridge whose diodes D1 to D4 are normally cut off and whose output S is shunted by a bridge P formed by diodes D5 to D8. This bridge is normally conducting.

A transfer command for the signal appearing at the input, i.e. a pulse coming from the clock H of FIG. 1, arrives at a point M tied to the base of a PNP transistor $T_1$. An NPN transistor $T_2$ has its base connected to the collector of transistor $T_1$ and its emitter connected that of a PNP transistor $T_3$; as the two latter transistors are of mutually complementary type, they are switched from cutoff to saturation. A positive square wave appears on the collector of transistor $T_3$ while a negative one appears on the collector of transistor $T_2$. These square waves pass respectively through capacitors $C_9$ and $C_8$ and cause bridge P to be cut off. They also unlock the sampling gate 1, working into charge-transfer device 2 whose input capacitor 7 forms the sample-storing capacitance, by passing through differentiating capacitors $C_7$ and $C_{10}$ so as to supply narrow pulses to the d-c diagonal of bridge $D_1$-$D_4$. During this very short opening time, a storage capacitance mainly formed by the activated cell of charge-transfer device 2—supplemented by a fixed capacitor $C_{11}$—tends to charge up to the value of the voltage present at the input terminal E. Capacitor $C_{11}$ retains its charge for a predetermined time, of the order of 15 nsec in the example described, after which the bridge P starts to conduct again. Before this, the cell of the charge-transfer device has been isolated from the fast gate by another cutoff of its diodes $D_1$-$D_4$. The conduction of bridge P quickly dissipates the remaining charge of holding capacitor $C_{11}$. In this way, the sampling gate here considered is returned in a very short time to its initial state and any spurious storage effect attributable to a voltage determined by the value of the preceding sample is canceled even though the gate is not 100% efficient.

As shown in FIG. 3, the integrated charge-transfer device 2 contains two sets of cells 9, 10 in the form of N independent storage capacitors, rspectively designated $K_1, K_2, \ldots K_N$ and $K'_1, K'_2, \ldots K'_N$, each of which is connected to the input terminal S of the device through a respective MOS field-effect transistor 13, 13' operating as an electronic switch. Each of the N storage capacitors of a set is further connected to a common output SC, SC' through a respective field-effect transistor 14, 14' controlling another FET 15, 15' which is coupled through a capacitor 16, 16' to an amplifier 17. Switches 13, 13' are closed in succession by a ring counter 11, 12 stepped by clock H via distributor 6. During each clock cycle, one cell of each set 9, 10 is connected to the inputs while the next one is connected to the output SC, SC'. The ring counters have a multiplicity of output leads each connected to a gate of a loading FET 13, 13' of one cell and to a gate of an unloading FET 14, 14' of an adjoining cell.

The operation of device 2 is represented in graphs (a) through (g) of the time diagram shown in FIG. 4.

Graph (a) shows the signal levels sampled at instants i, i+1, i+2, etc. by the gate 1 of FIG. 2 which is opened by the clock pulses on graph (b) at the rate of 10 MHz. This gate operates continuously while waiting for a transfer command.

For 50 nsec in the example described, the gate output is connected to the corresponding capacitive cell which it charges to its peak voltage. The delay $\phi$ (FIG. 1) between the charge-transfer clock pulses of graph (b) and the sampling pulses is such that the link between gate 1 and device 2 is interrupted before the gate output returns to zero. Simultaneously with the charging of any given cell (e.g. $K_1$), the next-following cell (e.g. $K_2$) is connected to the associated output.

For the next 50 nsec the last-mentioned cell is reset to zero, i.e. its connection to the output is maintained but the latter is grounded.

On the next clock cycle i+1, the sample charges the next cell and so forth. Graphs (c) through (f) show how successive samples charge the various cells to respective levels $L, L+1, L+2, \ldots L+N-1$.

When sample $L+N-1$ has been fed into the last nth cell, the fast sampling ceases and the train of charge-transfer clock pulses slows down (instant A). The clock cycle becomes 100 microseconds, for example. During the first slow half-cycle, i.e. between instants B and C, the sample $L+1$ is digitized—graph (g)—by the analog-digital converter 4 to 12 bits which may be relatively slow (low consumption, small size, small cost) and may be recorded digitally. In the next cycle, i.e. between instants D and E, the sample $L+2$ is digitized and so on up to sample $L+N-1$ which is digitized between instants F and G.

It may be noted that cell $K_1$ (or $K'_1$) sample L collected at instant i is reset to zero when the sample $L+N-1$ has been picked up by cell $K_N$ (or $K'_N$) at instant i+N−1. Hence the device of FIG. 3 allows only N−1 samples to be recorded.

The embodiment specifically described and illustrated contains five modular sampling and transfer asemblies (n=5). These assemblies operate with a relative time offset of 20 nsec during storage, as already noted, and 20 microseconds during the digitizing phase. As the sampling of the input signal lasts less than one nanosecond, a gate does not interfere with the input of its neighbor.

The practical realization is in the form of printed-circuit boards, when produced with integrated storage devices containing 100 cells for example, enables the digitization of 495 samples which are taken at the maximum rate of one sample every 20 nsec. Of the 12 bits digitized, only 10 may actually be used in order to provide a maximum signal-to-noise ratio.

A system for digitizing transients in accordance with the invention may contain up to 10 digitizing boards as thus defined. The clocks of the several boards are relatively offset by 20 nsec/k where k is the number of boards. Thus, with ten boards we can sample at a minimum rate of 2 nsec and record up to 4950 samples.

What we claim is:

1. A system for digitizing transient signals appearing at an input terminal, comprising:

a plurality of sampling gates connected in parallel to said input terminal;

a plurality of charge-transfer devices respectively connected to said sampling gates, each of said devices including a multiplicity of cells, a multiplicity of first switches for successively loading associated cells with incoming signal samples from the respective sampling gate and a multiplicity of second switches for successively reading out the contents of associated cells in the order of their loading to an output circuit common to all said cells, each of said first switches being paired for joint operation with a respective second switch associated with a different cell;

an analog-digital converter;

multiplexer means inserted between said charge-transfer devices and said converter for cyclically connecting the output circuits of all said devices to said converter until the contents of the cells of all said devices have been read out;

utilization means connected to said converter, and timing means connected to said sampling gates, said charge-transfer devices and said multiplexer means for briefly opening said sampling gates in cyclic succession at a relatively fast clock-pulse rate and for jointly operating said first and second switches of the respective charge-transfer devices in synchronism therewith during a first operational phase, said timing means being modified upon the loading of the cells of all said devices for thereupon jointly operating said first and second switch means of said charge-transfer devices in cyclic succession and in synchronism with said multiplexer means at a relatively slow clock-pulse rate for successively reading out the contents of all cells to said converter during a second operational phase, said output circuits being grounded during said first operational phase for clearing each cell via the associated second switch prior to loading same via the associated first switch, the connections between said sampling gates and said charge-transfer devices being blocked during said second operational phase.

2. A system as defined in claim 1 wherein each of said cells comprises a storage capacitor, each charge-transfer device being provided with a shunt capacitance in an input circuit thereof.

3. A system as defined in claim 2 wherein said first switches are first field-effect transistors inserted between the input circuit and respective storage capacitors of each charge-transfer device, said second switches being second field-effect transistors inserted between respective storage capacitors and the output circuit of each charge-transfer device, said timing means including a ring counter jointly controlling said first and second field-effect transistors.

4. A system as defined in claim 3 wherein said ring counter has a multiplicity of output leads each connected to a gate electrode of a first field-effect transistor and to a gate electrode of a second field-effect transistor respectively controlling the loading of one cell and the readout of an immediately following cell.

5. A system as defined in claim 1, 2, 3 or 4 wherein the number of said sampling gates and of said charge-transfer devices is five, said fast clock-pulse rate being 10 MHz, the opening of said sampling gates by said timing means being relatively staggered by intervals of 20 ns.

6. A system as defined in claim 5 wherein the number of cells per charge-transfer device is of the order of 100.

7. A system as defined in claim 6 wherein said charge-transfer devices are integrated in a printed-circuit board measuring approximately 190 mm by 120 mm in length and width.

* * * * *